(12) United States Patent
Xing et al.

(10) Patent No.: US 12,721,045 B2
(45) Date of Patent: Aug. 25, 2026

(54) SPINTRONICS MEMORY CELL AND METHOD OF MANUFACTURING THE SAME, MEMORY, AND METHOD OF STORING INFORMATION

(71) Applicant: Institute of Microelectronics, Chinese Academy of Sciences, Beijing (CN)

(72) Inventors: Guozhong Xing, Beijing (CN); Hao Zhang, Beijing (CN); Xuefeng Zhao, Beijing (CN); Ziwei Wang, Beijing (CN); Changqing Xie, Beijing (CN); Ming Liu, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 449 days.

(21) Appl. No.: 18/552,786

(22) PCT Filed: Jul. 12, 2022

(86) PCT No.: PCT/CN2022/105184
§ 371 (c)(1),
(2) Date: Sep. 27, 2023

(87) PCT Pub. No.: WO2024/011407
PCT Pub. Date: Jan. 18, 2024

(65) Prior Publication Data

US 2025/0089577 A1 Mar. 13, 2025

(51) Int. Cl.
*H10N 50/10* (2023.01)
*H10B 61/00* (2023.01)
(Continued)

(52) U.S. Cl.
CPC ............ *H10N 50/10* (2023.02); *H10B 61/00* (2023.02); *H10N 30/8554* (2023.02); *H10N 50/01* (2023.02); *H10N 50/85* (2023.02)

(58) Field of Classification Search
CPC ........ H10N 50/10; H10N 50/01; H10N 50/85; H10N 30/8554; H10B 61/00
(Continued)

(56) References Cited

U.S. PATENT DOCUMENTS 8,908,422 B2 * 12/2014 Tiercelin ............. G11C 11/2275 365/158
9,042,151 B2 * 5/2015 Annunziata ........... G11C 11/161 365/80
(Continued)

FOREIGN PATENT DOCUMENTS

CN 109949842 A 6/2019
CN 110211614 A 9/2019
(Continued)

OTHER PUBLICATIONS

International Search Report issued in Application No. PCT/US2022/105184, mailed on Dec. 16, 2022 (5 pages).
(Continued)

*Primary Examiner* — Eric W Jones
(74) *Attorney, Agent, or Firm* — Osha Bergman Watanabe & Burton LLP

(57) ABSTRACT

The memory cell includes: a piezoelectric substrate layer, wherein two ends of the piezoelectric substrate layer are respectively provided with a first electrode and a second electrode, and a current-free drive of skyrmion is implemented by applying a voltage to the first electrode and the second electrode; a magnetic layer on a surface of the piezoelectric substrate layer, wherein the magnetic layer is used to form a heterojunction with the piezoelectric substrate layer, and is used to generate, stabilize, and serve as a basic carrier for a movement of the skyrmion; wherein the magnetic layer includes a convex body, the convex body is configured to divide the magnetic layer into a bit region and a memory region, and the bit region is provided with a
(Continued)

magnetic tunnel junction used to perform generation and detection functions of the skyrmion.

18 Claims, 5 Drawing Sheets

(51) Int. Cl.
*H10N 30/853* (2023.01)
*H10N 50/01* (2023.01)
*H10N 50/85* (2023.01)

(58) Field of Classification Search
USPC .......................................................... 257/421
See application file for complete search history.

(56) References Cited

U.S. PATENT DOCUMENTS 9,129,679 B2* 9/2015 Fukuzumi ........... G11C 11/1675
10,186,595 B2* 1/2019 Rondinelli ............. H10D 1/684
11,069,390 B2* 7/2021 Hu ...................... H01F 10/3281
2006/0133137 A1* 6/2006 Shin ........................ G11C 11/15 365/158
2009/0016098 A1* 1/2009 Wunderlich ........ G11C 11/1675 365/158
2012/0267735 A1* 10/2012 Atulasimha ......... G11C 11/1675 257/E29.323
2013/0163313 A1* 6/2013 Tiercelin ............. G11C 11/2275 365/157
2014/0063893 A1* 3/2014 Fukuzumi .............. G11C 19/08 977/762
2019/0074044 A1* 3/2019 Atulasimha ......... G11C 11/5607
2019/0172998 A1* 6/2019 Tan ........................... C25B 1/04
2019/0190492 A1 6/2019 Ram et al.
2020/0381614 A1 12/2020 Min et al.
2021/0074344 A1* 3/2021 Hu ........................ G11C 11/161
2022/0181061 A1 6/2022 Roiz-Wilson

FOREIGN PATENT DOCUMENTS

CN 110228822 A 9/2019
CN 111064066 A 4/2020
CN 111785828 A 10/2020
CN 113284542 A 8/2021
CN 113393875 A 9/2021

OTHER PUBLICATIONS

Written Opinion issued in Application No. PCT/US2022/105184, mailed on Dec. 16, 2022 (4 pages).
Office Action issued in Chinese Application No. 202210822939.0, mailed on Jun. 3, 2025 (10 pages).
Chendong et al.; "Research progress and applications of magnetic skyrmions in micromagnetism;" China Academic Journal Electronic Publishing House; vol. 67; Issue 13; Jun. 22, 2018; pp. 1-14 (28 pages).
International Search Report issued in Application No. PCT/CN2022/105184, mailed on Dec. 16, 2022 (5 pages).
Written Opinion issued in Application No. PCT/CN2022/105184, mailed on Dec. 16, 2022 (4 pages).

* cited by examiner

SPINTRONICS MEMORY CELL AND METHOD OF MANUFACTURING THE SAME, MEMORY, AND METHOD OF STORING INFORMATION

CROSS-REFERENCE TO RELATED APPLICATION

This application is a Section 371 National Stage Application of International Application No. PCT/CN2022/105184, filed on Jul. 12, 2022, entitled "MEMORY CELL AND METHOD OF MANUFACTURING THE SAME, MEMORY, AND METHOD OF STORING INFORMATION", the content of which is hereby incorporated by reference in its entirety.

TECHNICAL FIELD

The present disclosure relates to a field of a spintronics technology, and in particular, to a memory cell, a method of manufacturing a memory cell, a memory, and a method of storing an information.

BACKGROUND

Skyrmion has many outstanding characteristics, such as unique topological protection characteristics, a high stability, an extremely compact size, a drive current threshold with 5 to 6 levels of magnitude lower than a magnetic domain wall, etc. The characteristics make it promising for a skyrmion-based racetrack memory to surpass a conventional magnetic domain wall racetrack memory and become a new generation of high-density nonvolatile memory.

Although the skyrmion-based racetrack memory has advantages of an ultra-high memory density, a low power consumption, a nonvolatility, etc. However, many problems may still exist in the skyrmion-based racetrack memory. For example, a storage method of the racetrack memory depends on a coordinated movement of all skyrmions on a nanobelt. Once a skyrmion is accidentally pinned, a data chaos or even a collapse of the entire nanobelt may be caused. For example, a current threshold for driving the skyrmion is far from a theoretical prediction, because when a defect is less than a size of the skyrmion, the skyrmion may not effectively avoid the defect, which means that the racetrack memory may have extremely stringent requirements for a process. For another example, in a process of movement, the skyrmion may be inevitably affected by a Skyrmion Hall Effect (SKHE). Under an action of a transverse Magnus force, the skyrmion may gradually shift to an edge of a racetrack, which may lead to an annihilation of the skyrmion under a heavy current. In order to avoid the phenomenon, the racetrack memory has to adopt a compromise design between a current density (write rate) and a "racetrack" width (memory density). In addition, under an interference of an external environment such as noise, a thermal fluctuation, a vibration and other factors, the skyrmion is prone to a non-ideal displacement, which may bring a great challenge to the nonvolatility of the memory.

SUMMARY

In view of this, the present disclosure provides a memory cell, a method of manufacturing a memory cell, a memory, and a method of storing an information, in order to at least partially solve the above-mentioned technical problems.

According to an aspect of the present disclosure, a memory cell is provided, including: a piezoelectric substrate layer, wherein two ends of the piezoelectric substrate layer are respectively provided with a first electrode and a second electrode, and a current-free drive of a skyrmion is implemented by applying a voltage to the first electrode and the second electrode; and a magnetic layer on a surface of the piezoelectric substrate layer, wherein the magnetic layer is configured to form a heterojunction with the piezoelectric substrate layer, and is configured to generate, stabilize, and serve as a basic carrier for a movement of the skyrmion; wherein the magnetic layer includes a convex body, the convex body is configured to divide the magnetic layer into a bit region and a memory region, and the bit region is provided with a magnetic tunnel junction configured to perform generation and detection functions of the skyrmion.

According to embodiments of the present disclosure, the piezoelectric substrate layer is configured to generate a strain under an action of an electric field, and the strain is transferred to the magnetic layer through the heterojunction to drive the skyrmion to move on the magnetic layer.

According to embodiments of the present disclosure, a current is injected in a direction perpendicular to a surface of the magnetic tunnel junction, so as to induce a formation of a stable skyrmion in the bit region.

According to embodiments of the present disclosure, the magnetic tunnel junction is configured to detect whether the skyrmion exists in the bit region according to a tunneling magneto resistance effect, and a "0" bit state is recorded if the skyrmion exists in the bit region; and a "1" bit state is recorded when the skyrmion is in the memory region; when the skyrmion is in the bit region, a first voltage is applied to the first electrode and the second electrode to drive the skyrmion to move from the bit region to the memory region, so as to implement a switching from the "0" bit state to the "1" bit state; and when a second voltage is applied to the first electrode and the second electrode, the skyrmion is driven to move from the memory region to the bit region, so as to implement a switching from the "1" bit state to the "O" bit state, wherein a direction of the second voltage is opposite to a direction of the first voltage.

According to embodiments of the present disclosure, the skyrmion is moved in a direction in which the strain increases.

According to embodiments of the present disclosure, a material of the piezoelectric substrate layer is one or more of a lead zirconate titanate, a lead niobium magnesium titanate, La—$BiFeO_3$, Sm—$BiFeO_3$, and $BaTiO_3$—$BiMgTiO_3$.

According to embodiments of the present disclosure, a height of the convex body is higher than a height of the bit region and a height of the memory region, so that the skyrmion does not move to another region due to a disturbance of an external environment when the skyrmion is confined in a region of the magnetic layer.

According to embodiments of the present disclosure, a material of the magnetic layer is one or more of Co, CoFeB, CoFe, and FeNi.

According to embodiments of the present disclosure, the memory cell further includes: a heavy metal layer between the piezoelectric substrate layer and the magnetic layer, wherein the heavy metal layer is configured to provide a Dzyaloshinskii-Moriya interaction.

According to embodiments of the present disclosure, a material of the heavy metal layer is one or more of W. Ta, Pt, Pd, Ph, Ir, Pb and Au.

According to another aspect of the present disclosure, a method of storing an information is provided, applied to the memory cell as described above, including: applying a first current to a magnetic tunnel junction, so as to form a stable skyrmion in a bit region of a magnetic layer; and applying a first voltage to a first electrode and a second electrode, so that a piezoelectric substrate layer generates a first strain, wherein the first strain is transferred to the magnetic layer through a heterojunction to drive the skyrmion to move from the bit region of the magnetic layer to a memory region of the magnetic layer, so as to write a to-be-stored information.

According to embodiments of the present disclosure, the method further includes: applying a second voltage to the first electrode and the second electrode, so that the piezoelectric substrate layer generates a second strain, wherein the second strain is transferred to the magnetic layer through the heterojunction to drive the skyrmion to move from the memory region of the magnetic layer to the bit region of the magnetic layer, so as to erase the to-be-stored information; wherein a direction of the second voltage is opposite to a direction of the first voltage.

According to embodiments of the present disclosure, the method further includes: applying a second current to the magnetic tunnel junction, and reading a resistance state information of the magnetic tunnel junction, so as to read the to-be-stored information.

According to embodiments of the present disclosure, a speed at which the skyrmion moves between the bit region of the magnetic layer and the memory region of the magnetic layer is determined based on voltage values applied to the first electrode and the second electrode.

According to embodiments of the present disclosure, wherein in a case of the skyrmion is in the memory region of the magnetic layer corresponds to a "1" bit state; and in a case of the skyrmion is in the bit region of the magnetic layer corresponds to a "0" bit state.

According to another aspect of the present disclosure, a method of manufacturing a memory cell is provided, including: manufacturing a magnetic layer on a piezoelectric substrate layer, wherein the magnetic layer includes a convex body, and the convex body is configured to divide the magnetic layer into a bit region and a memory region; manufacturing a magnetic tunnel junction in the bit region of the magnetic layer; and manufacturing a first electrode and a second electrode at two ends of the piezoelectric substrate layer, respectively.

According to embodiments of the present disclosure, the method further includes: manufacturing a heavy metal layer between the piezoelectric substrate layer and the magnetic layer.

According to another aspect of the present disclosure, a memory is provided, including: the memory cell according to any one of the above-mentioned embodiments, or a memory cell manufactured by the method of manufacturing a memory cell according to any one of the above-mentioned embodiments.

BRIEF DESCRIPTION OF THE DRAWINGS

The technical content of the present disclosure will be further described with reference to embodiments and accompanying drawings, in which.

DESCRIPTION OF SYMBOLS

Figure 1:
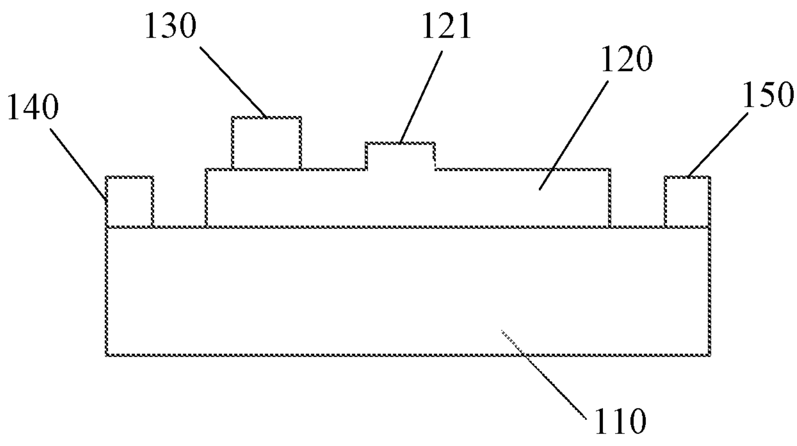
FIG. 1 shows a front view of a memory cell according to embodiments of the present disclosure.

110: piezoelectric substrate layer; 120: magnetic layer; 121: convex body; 122: bit region; 123: memory region; 130: magnetic tunnel junction; 140: first electrode; 150: second electrode; 10: skyrmion; 301 to 302 and 601 to 603: processes.

DETAILED DESCRIPTION OF EMBODIMENTS

The technical solution in embodiments of the present disclosure will be clearly and completely described with reference to embodiments and accompanying drawings. Obviously, the described embodiments are some, but not all of embodiments of the present disclosure. Based on the described embodiments of the present disclosure, all other embodiments obtained by those skilled in the art without any creative work fall within the scope of protection of the present disclosure.

It should be noted that in the accompanying drawings or descriptions of the specification, the similar or same parts are indicated by the same drawing number. The implementation not shown or described in the accompanying drawings is a form known to those skilled in the art. Moreover, although an example of a parameter containing a specific value may be provided, it should be understood that the parameter does not need to be exactly equal to a corresponding value, but may approximate to a corresponding value within an acceptable error tolerance or design constraint. In addition, directional terms mentioned in the following embodiments, such as "up", "down", "front", "back", "left", "right", "inside", "outside", etc., are only directions referring to the accompanying drawings. Therefore, the directional terms used are intended to illustrate and not to limit the present disclosure.

In addition, if descriptions of "first", "second", etc. are involved in embodiments of the present disclosure, the descriptions of "first", "second", etc. are only used for the purpose of description, and should not be construed as indicating or implying a relative importance or impliedly implying the number of indicated technical features. Therefore, features defined by "first" and "second" may explicitly or implicitly that at least one of the features is included.

Skyrmion has many outstanding characteristics, such as unique topological protection characteristics, a high stability, an extremely compact size, a drive current threshold with 5 to 6 levels of magnitude lower than a magnetic domain wall, etc. The characteristics make it promising for a skyrmion-based racetrack memory to surpass a conventional magnetic domain wall racetrack memory and become a new generation of high-density nonvolatile memory.

In a process of implementing the concept of the present disclosure, the inventor found that many problems may still exist in the skyrmion-based racetrack memory. Firstly, a storage method of the racetrack memory depends on a coordinated movement of all skyrmion on a nanobelt. Once a skyrmion is accidentally pinned, a data chaos or even a collapse of the entire nanobelt may be caused. Secondly, a current threshold for driving the skyrmion is far from a theoretical prediction, because when a defect is less than a size of the skyrmion, the skyrmion may not effectively avoid the defect, which means that the racetrack memory may have extremely stringent requirements for a process. Thirdly, in a process of movement, the skyrmion may be inevitably affected by a Skyrmion Hall Effect (SKHE). Under an action of a transverse Magnus force, the skyrmion may gradually shift to an edge of a racetrack, which may lead to an annihilation of the skyrmion under a heavy current. In order to avoid the phenomenon, the racetrack memory has to adopt a compromise design between a current density (write rate) and a "racetrack" width (memory density). Finally, under an interference of an external environment such as noise, a thermal fluctuation, a vibration and other factors, the skyrmion is prone to a non-ideal displacement, which may bring a great challenge to the nonvolatility of the memory In view of this, the present disclosure provides a memory cell, a method of manufacturing a memory cell, a memory, and a method of storing an information, in order to at least partially solve the above-mentioned technical problems.

Figure 2:
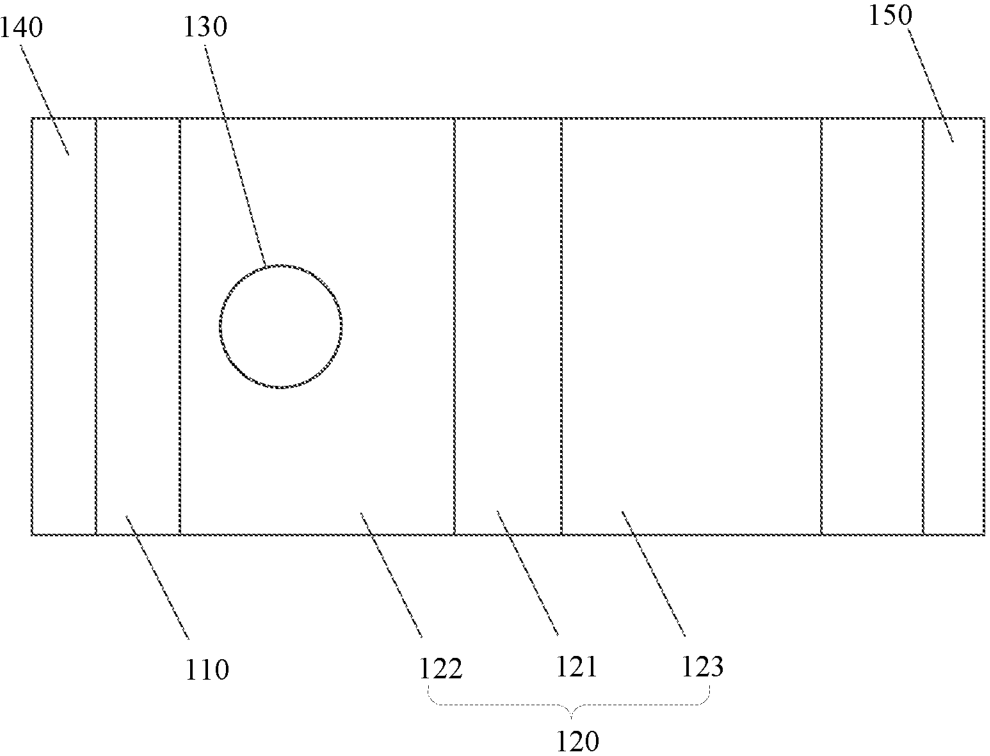
FIG. 2 shows a top view of a memory cell according to embodiments of the present disclosure.

FIG. 1 shows a front view of a memory cell according to embodiments of the present disclosure, and FIG. 2 shows a top view of a memory cell according to embodiments of the present disclosure.

Please refer to FIG. 1 and FIG. 2, the memory cell includes a piezoelectric substrate layer 110 and a magnetic layer 120. Two ends of the piezoelectric substrate layer 110 are respectively provided with a first electrode 140 and a second electrode 150. The magnetic layer 120 is on a surface of the piezoelectric substrate layer 110. The magnetic layer 120 is used to form a heterojunction with the piezoelectric substrate layer 110, and is used to generate, stabilize, and serve as a basic carrier for a movement of the skyrmion. The magnetic layer 120 includes a convex body 121, the convex body 121 is configured to divide the magnetic layer 120 into a bit region 122 and a memory region 123, and a magnetic tunnel junction 130 is provided in the bit region 122.

In embodiments of the present disclosure, the magnetic tunnel junction 130 may be used to implement an induced generation and detection of the skyrmion. When a current is injected into the magnetic tunnel junction 130 in a direction perpendicular to a surface of the magnetic tunnel junction 130, the current may be polarized into a spin polarized current. The magnetic layer 120 may form a stable Bloch skyrmion in the bit region 122 under an induction of the spin polarized current. Moreover, once a stable skyrmion is formed in the bit region 122, it is not required to continue to generate the skyrmion subsequently. Compared to a racetrack memory that needs to be continuously generated by the skyrmion to write an information, the solution of the present disclosure may have a better stability and a high repeatability, and reduce a power consumption of a device.

The magnetic tunnel junction 130 may detect whether the skyrmion exists in a corresponding region according to a tunneling magneto resistance (TMR) effect. For example, in a process of inducing a generation of the skyrmion, the magnetic tunnel junction 130 may detect whether the skyrmion exists in the bit region 122 according to the tunneling magneto resistance effect to determine whether a stable skyrmion has been formed in the bit region 122, so that a reliability of the device may be improved.

In embodiments of the present disclosure, a location of the skyrmion on the magnetic layer 120 may represent different bit states. For example, if the skyrmion is in the bit region 122, it may represent a "0" bit state; if the skyrmion is in the memory region 123, it may represent a "1" bit state. Therefore, an information may be stored by driving the skyrmion to "shuttle back and forth" between different regions of the magnetic layer 120. It may be understood that the location of the skyrmion on the magnetic layer 120 may correspond to different bit states, which is not limited to the above-mentioned examples. Specifically, a corresponding relationship between the location of the skyrmion and bit data may be set according to an actual application.

Figure 3:
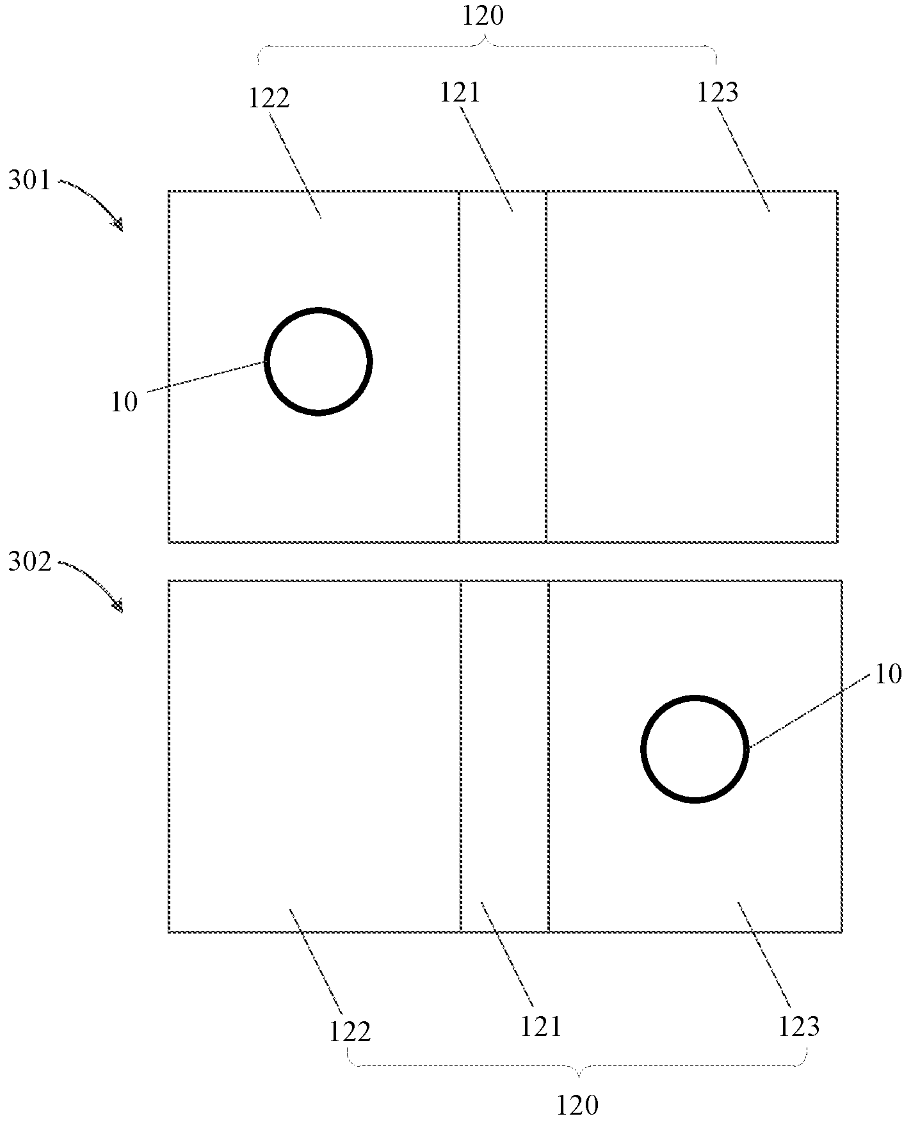
FIG. 3 shows a data type representation diagram according to embodiments of the present disclosure.

FIG. 3 shows a data type representation diagram according to embodiments of the present disclosure. A bit state corresponding to the location of the skyrmion will be exemplarily described below with reference to FIG. 3. FIG. 3 schematically shows a bit state 301 when the skyrmion is in the bit region 122 and a bit state 302 when the skyrmion is in the memory region 123.

As shown in FIG. 3, the convex body 121 divides the magnetic layer 120 into the bit region 122 and the memory region 123. If a skyrmion 10 is in the bit region 122, the bit state may be indicated as "0". If the skyrmion 10 is in the memory region 123, the bit state may be indicated as "1". Certainly, the present disclosure is not limited to this. In some embodiments, it may be set that the corresponding bit state is "1" when the skyrmion 10 is in the bit region 122, and the corresponding bit state is "0" when the skyrmion 10 is in the memory region 123. Based on the above-mentioned mechanism, the information may be stored by driving the skyrmion to "shuttle back and forth" between different regions of the magnetic layer 120.

Since the location of the skyrmion may correspond to different bit states, the bit data may be read by using the location of the skyrmion detected by the magnetic tunnel junction 130. For example, if the skyrmion is in the bit region 122, the "0" bit state is indicated, and if the skyrmion is in the memory region 123, the "1" bit state is indicated. In the corresponding relationship, when the magnetic tunnel junction 130 detects that the skyrmion 10 is in the bit region 122, bit data "O" is read, and when the skyrmion 10 is not in the bit region 122, bit data "1" is read.

Referring back to FIG. 1 and FIG. 2, in embodiments of the present disclosure, the piezoelectric substrate layer 110 may functionally serve as a drive layer. A certain potential difference in an entire longitudinal direction may be generated by applying a voltage to the first electrode 140 and the second electrode 150 at two ends of the piezoelectric substrate layer 110. A reverse piezoelectric effect may occur in the piezoelectric substrate layer 110 under an action of an electric field, resulting in a strain. The strain may be further transferred to the magnetic layer 120 through a heterojunction to drive the skyrmion to move on the magnetic layer 120. It may be understood that the strain generated at different locations may be different, and the strain may gradually increase in a direction in which an potential increases, and the skyrmion may move in a direction in which the strain increases, so as to implement a pure electric field drive of the skyrmion, and further reduce a power consumption of the device and reduce a size of the device.

In embodiments of the present disclosure, a height of the convex body 121 may be slightly higher than a height of the bit region 122 and a height of the memory region 123, so that a certain barrier height may be formed at the convex body 121. The convex body 121 may serve as a barrier region functionally. Since the convex body 121 has a certain energy barrier, the skyrmion may not move to another region due to a disturbance of an external environment (such as noise, a thermal fluctuation, a vibration, etc.) when the skyrmion is confined in a certain region of the magnetic layer 120. For example, when the skyrmion is in the bit region 122, because of an existence of an intermediate barrier, the skyrmion may not move to the memory region 123 due to the disturbance of the external environment. In this way, the skyrmion may be avoided from moving to another region due to an influence of the external environment, resulting in an information storage error, so that a stability and a nonvolatility of the memory may be improved.

In addition, a strength of the energy barrier of the convex 121 is determined, so a speed of the skyrmion passing through the barrier region may be controlled by changing the voltage applied to the first electrode 140 and the second electrode 150. It may be understood that when the voltage is small, a strain generated by the piezoelectric substrate 110 is small. At this time, the skyrmion has a low speed, and may not be able to pass through the barrier region. The skyrmion is confined in the bit region 122. With an increase of the voltage, the strain increases, and the speed of the skyrmion also increases gradually. When the voltages on both sides of the device reach a certain threshold, an enough strain may be generated to drive the skyrmion to cross the barrier region to the memory region 123, so as to write a bit information.

Figure 4:
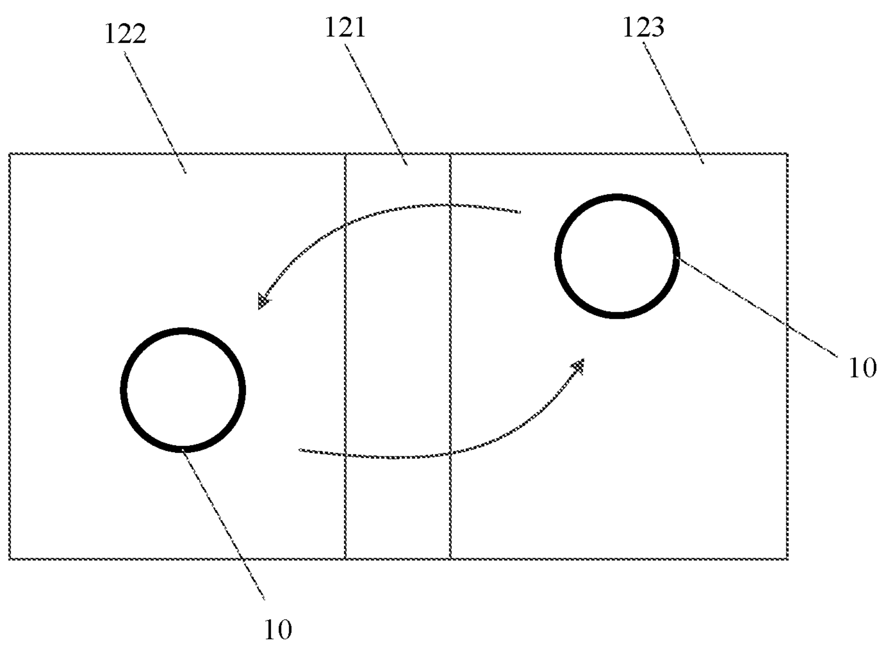
FIG. 4 shows a schematic diagram of a dynamic trajectory of a skyrmion on a magnetic layer according to embodiments of the present disclosure.

FIG. 4 shows a schematic diagram of a dynamic trajectory of a skyrmion on a magnetic layer according to embodiments of the present disclosure.

Please refer to FIG. 1 and FIG. 4 together, when the skyrmion 10 is in the bit region 122, that is, in the "O" bit state, a forward voltage is applied to the first electrode 140 and the second electrode 150, so that the piezoelectric substrate layer 110 generates a first strain. The first strain is transferred to the magnetic layer 120 through the heterojunction. Driven by the first strain, the skyrmion 10 gradually moves from the bit region 122 to the memory region 123 in the direction (a direction parallel to the electric field) in which the strain increases, so that a switching from the "0" bit state to the "1" bit state may be implemented.

In the above-mentioned process, due to an influence of a Hall effect, the skyrmion 10 still has a tendency to deflect in a vertical direction. Therefore, a movement trajectory of the skyrmion 10 is actually a curve that gradually deviates to an edge of the magnetic layer 120 (as shown in FIG. 4). If the skyrmion 10 has a long movement path, such as a movement of the skyrmion on the racetrack memory, a reliability of data storage may not be facilitated. However, in embodiments of the present disclosure, since the skyrmion 10 implements an information storage by "shuttling back and forth" between the bit region 122 and the memory region 123, the skyrmion 10 may implement an information switching by only a path with a small movement. Based on this, the skyrmion 10 is not significantly affected by the Hall effect.

A reverse voltage (a direction of the reverse voltage is opposite to a direction of the forward voltage) is applied to the first electrode 140 and the second electrode 150, so that the piezoelectric substrate layer 110 generates a second strain. The second strain is transferred to the magnetic layer 120 through the heterojunction. Under a drive of the second strain, the skyrmion 10 returns to the bit region 122 from the memory region 123, so that a switching from the "1" bit state to the "0" bit state may be implemented. In the process, a Magnus force is always perpendicular to a moving direction. When the skyrmion 10 moves in an opposite direction (that is, returning from the memory region 123 to the bit region 122), a direction of the Magnus force also reverses, so that a lateral displacement deflected by the Hall effect may be corrected to some extent. Compared to the racetrack memory, the solution of the present disclosure may significantly improve a stability and a reliability of the device.

It should be noted that the forward voltage of the present disclosure may means that a potential of the first electrode 140 is lower than a potential of the second electrode 150. Accordingly, the reverse voltage may means that the potential of the first electrode 140 is higher than the potential of the second electrode 150. Certainly, the present disclosure is not limited to this.

Figure 5:
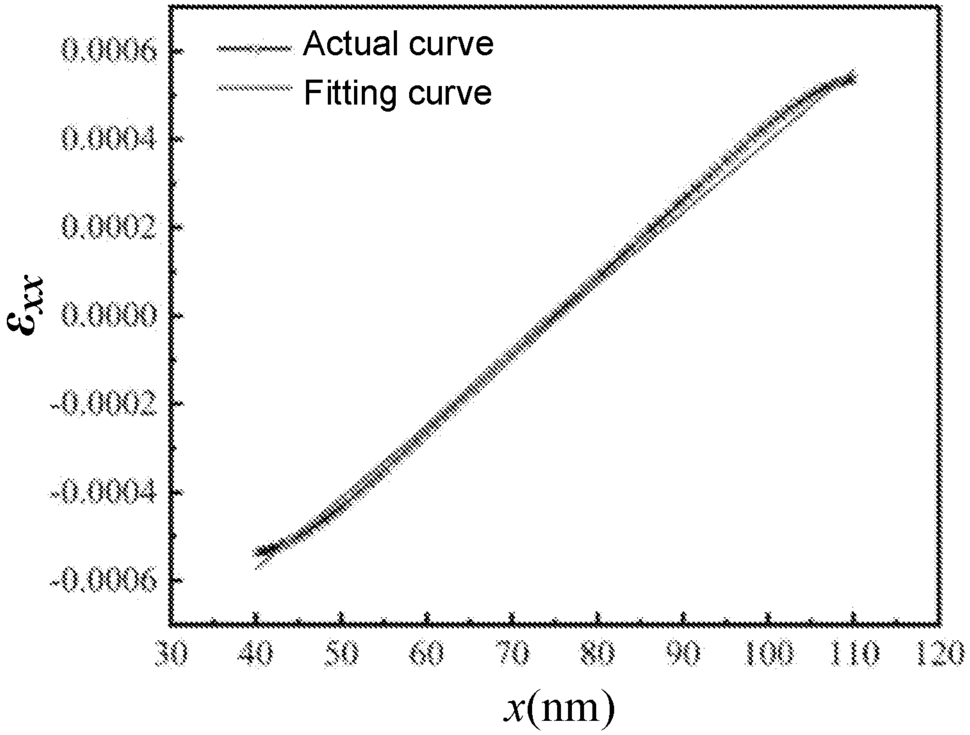
FIG. 5 shows a strain curve generated by a piezoelectric substrate layer on a magnetic layer according to embodiments of the present disclosure.
Figure 6:
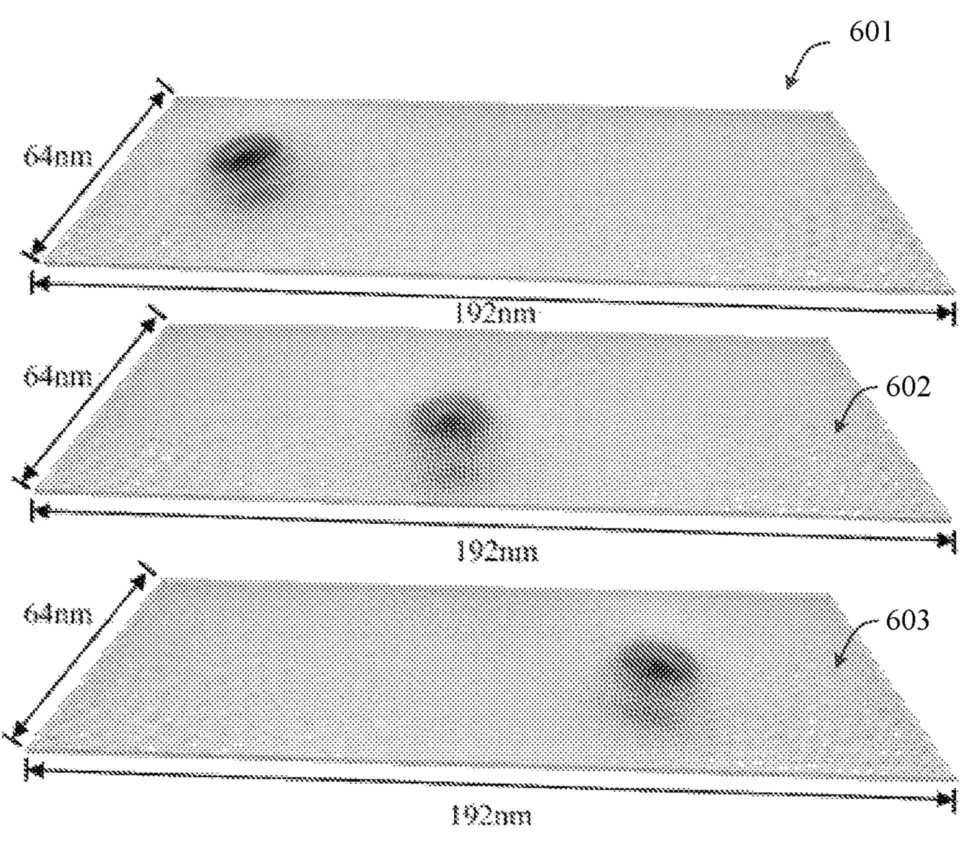
FIG. 6 shows a simulation junction diagram of mumax3 of a skyrmion driven by a strain according to embodiments of the present disclosure.

FIG. 5 shows a strain curve generated by a piezoelectric substrate layer on a magnetic layer according to embodiments of the present disclosure, and FIG. 6 shows a simulation junction diagram of mumax3 of a skyrmion driven by a strain according to embodiments of the present disclosure. A process of the skyrmion being driven by the strain will be described below with reference to FIG. 5 and FIG. 6.

In FIG. 5, the abscissa represents a distance in an x-direction, which may be expressed in a unit of nm. The ordinate represents a component of a strain tensor in the x-direction, which may be expressed in a unit of 1. The x-direction may refer to a direction of the movement trajectory of the skyrmion.

In embodiments of the present disclosure, when the forward voltage such as 2V is applied between the first electrode 140 and the second electrode 150 (shown in FIG. 1), the curve shown in FIG. 5 is measured. A slope of the curve represents a strain gradient. As shown in FIG. 5, within a range of 40 nm to 110 nm in the x-direction, the strain transferred from the piezoelectric substrate layer 110 to the magnetic layer 120 through the heterojunction gradually increases in the direction in which the potential increases, and the strain gradient remains substantially constant, with a magnitude of $1.6\times10^{-3}$%/nm.

FIG. 6 shows the simulation junction diagram of mumax3 of the skyrmion driven by the strain. The magnitude of the strain gradient for driving the movement of the skyrmion may use a result shown in FIG. 5.

In FIG. 6, a length direction with a magnitude of 192 nm may be in the above-mentioned x-direction. 601 to 603 respectively show locations of the skyrmion on the magnetic layer at different time points. In processes shown in 601 to 603, the skyrmion may move in the direction in which the strain increases, so that a low power consumption drive of the skyrmion in a pure electric field without a current may be implemented.

In the technical solution of the present disclosure, an electric field is applied to the piezoelectric substrate layer using a piezoelectric substrate layer/magnetic layer heterojunction structure, and the skyrmion is driven by a strain generated by a converse piezoelectric effect, so that the low power consumption drive of the skyrmion in the pure electric field without the current may be implemented, and a power consumption of the device may be reduced. Moreover, a design based on the convex body may avoid the information storage error in the skyrmion due to the influence of the external environment, so that the stability and the nonvolatility of the memory may be improved. In addition, the speed of the skyrmion may be adjusted by changing the voltage applied to the piezoelectric substrate layer, so that a high access speed may be implemented.

In some embodiments, the above-mentioned memory cell may further include a heavy metal layer between the piezoelectric substrate layer and the magnetic layer. The heavy metal layer may provide a Dzyaloshinskii-Moriya Interaction (DMI) to generate a stable Néel skyrmion in the bit region 122 of the magnetic layer 120.

In embodiments of the present disclosure, for example, a material of the piezoelectric substrate layer may include, but is not limited to, one or more of a lead zirconate titanate, a lead niobium magnesium titanate, La—$BiFeO_3$, Sm—$BiFeO_3$, and $BaTiO_3$—$BiMgTiO_3$. A material of the magnetic layer may include, but is not limited to, one or more of Co, CoFeB, CoFe, and FeNi. A material of the heavy metal layer may include, but is not limited to, one or more of W, Ta, Pt, Pd, Ph, Ir, Pb, and Au.

According to embodiments of the present disclosure, sizes, quantity, etc. of the piezoelectric substrate layer, the magnetic layer, and the heavy metal layer may be designed according to actual application scenarios, which will not be limited here.

According to embodiments of the present disclosure, the first electrode and the second electrode may be formed from materials with a good conductivity, examples of which include but are not limited to Cu, Ag, Ta, etc. No special limitation is imposed on the sizes of the first electrode and the second electrode, as long as the first electrode and the second electrode may provide an electric field to the piezoelectric substrate layer.

Based on the structure of the above-mentioned memory cell, the present disclosure further provides a method of manufacturing a memory cell. The method will be described in detail with reference to FIG. 7.

Figure 7:
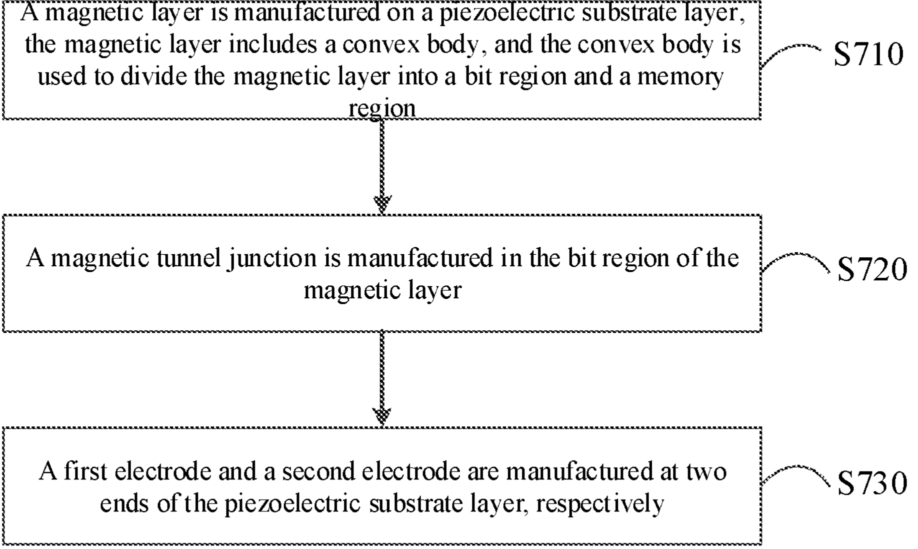
FIG. 7 shows a flowchart of a method of manufacturing a memory cell according to embodiments of the present disclosure.

FIG. 7 shows a flowchart of a method of manufacturing a memory cell according to embodiments of the present disclosure.

As shown in FIG. 7, the method of manufacturing a memory cell includes steps S710 to S730.

In step S710, a magnetic layer is manufactured on a piezoelectric substrate layer, the magnetic layer includes a convex body, and the convex body is used to divide the magnetic layer into a bit region and a memory region.

In step S720, a magnetic tunnel junction is manufactured in the bit region of the magnetic layer.

In step S730, a first electrode and a second electrode are manufactured at two ends of the piezoelectric substrate layer, respectively.

In some embodiments, a heavy metal layer may also be manufactured between the piezoelectric substrate layer and the magnetic layer. The heavy metal layer may provide the Dzyaloshinskii-Moriya Interaction to generate a stable Néel skyrmion in the bit region of the magnetic layer.

In embodiments of the present disclosure, the memory cell may be manufactured in a simple and efficient manner, and the memory cell may be used to implement the low power consumption drive of the skyrmion in the pure electric field without the current, so that the power consumption of the device may be reduced. In addition, the design based on the convex body may avoid the information storage error in the skyrmion due to the influence of the external environment, so that the stability and the nonvolatility of the memory may be improved.

According to another aspect of the present disclosure, there is further provided a method of storing an information, which is applied to a memory cell. The method will be described in detail with reference to FIG. 8.

Figure 8:
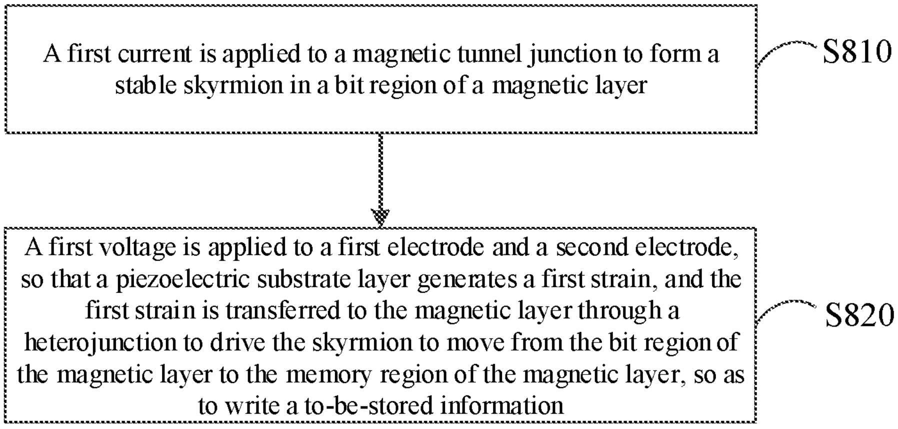
FIG. 8 shows a flowchart of a method of storing an information according to embodiments of the present disclosure.

FIG. 8 shows a flowchart of a method of storing an information according to embodiments of the present disclosure.

As shown in FIG. 8, the method of storing an information includes steps S810 to S820. The steps S810 to S820 may be performed for at least one memory cycle.

In step S810, a first current is applied to a magnetic tunnel junction to form a stable skyrmion in a bit region of a magnetic layer.

According to embodiments of the present disclosure, for example, a current direction of the first current may be perpendicular to a surface of the magnetic tunnel junction, so that the magnetic tunnel junction may be polarized into a spin polarized current, so as to form a stable skyrmion in the bit region of the magnetic layer.

For example, the so-called skyrmion here may be a Bloch skyrmion or a Néel skyrmion, which will not be limited in the present disclosure.

In embodiments of the present disclosure, a third current may be applied to the magnetic tunnel junction to detect whether the stable skyrmion is formed the bit region. If the stable skyrmion is formed in the bit region, it is not required to continue to generate the skyrmion subsequently. Compared to the racetrack memory that needs to be continuously generated by the skyrmion to write an information, the solution of the present disclosure may have a better stability and a high repeatability, and reduce the power consumption of the device.

In step S820, a first voltage is applied to a first electrode and a second electrode, so that a piezoelectric substrate layer generates a first strain, and the first strain is transferred to the magnetic layer through a heterojunction to drive the skyrmion to move from the bit region of the magnetic layer to the memory region of the magnetic layer, so as to write a to-be-stored information.

According to embodiments of the present disclosure, the location of the skyrmion on the magnetic layer may represent different bit states. For example, if the skyrmion is in the memory region of the magnetic layer, it corresponds to a "1" bit state; if the skyrmion being in the bit region of the magnetic layer, it corresponds to a "0" bit state. Therefore, the information storage may be implemented by driving the skyrmion to "shuttle" between different regions of the magnetic layer.

According to embodiments of the present disclosure, for example, the first voltage may be a forward voltage. The forward voltage is the same as or similar as the above-mentioned definition, which will not be repeated here.

In some embodiments, a second voltage may be applied to the first electrode and the second electrode, so that the piezoelectric substrate layer generates a second strain. The second strain is transferred to the magnetic layer through the heterojunction to drive the skyrmion to move from the memory region of the magnetic layer to the bit region of the magnetic layer, so as to erase the to-be-stored information.

According to embodiments of the present disclosure, a direction of the second voltage is opposite to a direction of the first voltage. For example, the second voltage may be a reverse voltage. The reverse voltage is the same as or similar to the above-mentioned definition, which will not be repeated here.

In some embodiments, a second current may be applied to the magnetic tunnel junction to read a resistance state information of the magnetic tunnel junction, so as to read the to-be-stored information.

According to embodiments of the present disclosure, a speed at which the skyrmion moves between the bit region of the magnetic layer and the memory region of the magnetic layer is determined based on voltage values applied to the first electrode and the second electrode. The speed of the skyrmion may be adjusted by changing the voltage applied to the first electrode and the second electrode, so that the high access speed may be implemented.

According to another aspect of the present disclosure, a memory is provided. The memory may include the memory cell according to any one of the above-mentioned embodiments, or a memory cell manufactured by the method of manufacturing a memory cell according to any one of the above-mentioned embodiments.

It should be noted that implementations, solved technical problems, achieved functions, and produced technical effects of each structure in the apparatus embodiments are the same as or similar to implementations, solved technical problems, achieved functions, and produced technical effects of each corresponding step in the method embodiments, which will not be repeated here.

The above-mentioned specific embodiments have further described the objectives, technical solutions and advantages of the present disclosure in detail. It should be understood that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A memory cell, comprising:

a piezoelectric substrate layer, wherein two ends of the piezoelectric substrate layer are respectively provided with a first electrode and a second electrode, and a current-free drive of a skyrmion is implemented by applying a voltage to the first electrode and the second electrode; and a magnetic layer on a surface of the piezoelectric substrate layer, wherein the magnetic layer is configured to form a heterojunction with the piezoelectric substrate layer, and is configured to generate, stabilize, and serve as a basic carrier for a movement of the skyrmion;

wherein the magnetic layer comprises a convex body, the convex body is configured to divide the magnetic layer into a bit region and a memory region, and the bit region is provided with a magnetic tunnel junction configured to perform generation and detection functions of the skyrmion.

2. The memory cell according to claim 1, wherein the piezoelectric substrate layer is configured to generate a strain under an action of an electric field, and the strain is transferred to the magnetic layer through the heterojunction to drive the skyrmion to move on the magnetic layer.

3. The memory cell according to claim 2, wherein a current is injected in a direction perpendicular to a surface of the magnetic tunnel junction, so as to induce a formation of a stable skyrmion in the bit region.

4. The memory cell according to claim 3, wherein the magnetic tunnel junction is configured to detect whether the skyrmion exists in the bit region according to a tunneling magneto resistance effect, and a "0" bit state is recorded if the skyrmion exists in the bit region; and a "1" bit state is recorded when the skyrmion is in the memory region;

when the skyrmion is in the bit region, a first voltage is applied to the first electrode and the second electrode to drive the skyrmion to move from the bit region to the memory region, so as to implement a switching from the "0" bit state to the "1" bit state; and when a second voltage is applied to the first electrode and the second electrode, the skyrmion is driven to move from the memory region to the bit region, so as to implement a switching from the "1" bit state to the "0" bit state, wherein a direction of the second voltage is opposite to a direction of the first voltage.

5. The memory cell according to claim 2, wherein the skyrmion is moved in a direction in which the strain increases.

6. The memory cell according to claim 1, wherein a material of the piezoelectric substrate layer is one or more of a lead zirconate titanate, a lead niobium magnesium titanate, La—$BiFeO_3$, Sm—$BiFeO_3$, and $BaTiO_3$—$BiMgTiO_3$.

7. The memory cell according to claim 1, wherein a height of the convex body is higher than a height of the bit region and a height of the memory region, so that the skyrmion does not move to another region due to a disturbance of an external environment when the skyrmion is confined in a region of the magnetic layer.

8. The memory cell according to claim 1, wherein a material of the magnetic layer is one or more of Co, CoFeB, CoFe, and FeNi.

9. The memory cell according to claim 1, further comprising:

a heavy metal layer between the piezoelectric substrate layer and the magnetic layer, wherein the heavy metal layer is configured to provide a Dzyaloshinskii-Moriya interaction.

10. The memory cell according to claim 9, wherein a material of the heavy metal layer is one or more of W, Ta, Pt, Pd, Ph, Ir, Pb and Au.

11. A method of storing an information, applied to the memory cell according to claim 1, comprising:

applying a first current to a magnetic tunnel junction, so as to form a stable skyrmion in a bit region of a magnetic layer; and applying a first voltage to a first electrode and a second electrode, so that a piezoelectric substrate layer generates a first strain, wherein the first strain is transferred to the magnetic layer through a heterojunction to drive the skyrmion to move from the bit region of the magnetic layer to a memory region of the magnetic layer, so as to write a to-be-stored information.

12. The method of storing an information according to claim 11, further comprising:

applying a second voltage to the first electrode and the second electrode, so that the piezoelectric substrate layer generates a second strain, wherein the second strain is transferred to the magnetic layer through the heterojunction to drive the skyrmion to move from the memory region of the magnetic layer to the bit region of the magnetic layer, so as to erase the to-be-stored information; wherein a direction of the second voltage is opposite to a direction of the first voltage.

13. The method of storing an information according to claim 11, further comprising:

applying a second current to the magnetic tunnel junction, and reading a resistance state information of the magnetic tunnel junction, so as to read the to-be-stored information.

14. The method of storing an information according to claim 11, wherein a speed at which the skyrmion moves between the bit region of the magnetic layer and the memory region of the magnetic layer is determined based on voltage values applied to the first electrode and the second electrode.

15. The method of storing an information according to claim 11, wherein a case of the skyrmion is in the memory region of the magnetic layer corresponds to a "1" bit state; and in a case of the skyrmion is in the bit region of the magnetic layer corresponds to a "0" bit state.

16. A method of manufacturing a memory cell, comprising:

manufacturing a magnetic layer on a piezoelectric substrate layer, wherein the magnetic layer comprises a convex body, and the convex body is configured to divide the magnetic layer into a bit region and a memory region;

manufacturing a magnetic tunnel junction in the bit region of the magnetic layer; and manufacturing a first electrode and a second electrode at two ends of the piezoelectric substrate layer, respectively.

17. The method of manufacturing a memory cell according to claim 16, further comprising:

manufacturing a heavy metal layer between the piezoelectric substrate layer and the magnetic layer.

18. A memory, comprising:

a memory cell, comprising: a piezoelectric substrate layer, wherein two ends of the piezoelectric substrate layer are respectively provided with a first electrode and a second electrode, and a current-free drive of a skyrmion is implemented by applying a voltage to the first electrode and the second electrode; and a magnetic layer on a surface of the piezoelectric substrate layer, wherein the magnetic layer is configured to form a heterojunction with the piezoelectric substrate layer, and is configured to generate, stabilize, and serve as a basic carrier for a movement of the skyrmion, wherein the magnetic layer comprises a convex body, the convex body is configured to divide the magnetic layer into a bit region and a memory region, and the bit region is provided with a magnetic tunnel junction configured to perform generation and detection functions of the skyrmion.

* * * * *